(12) United States Patent
Miles et al.

(10) Patent No.: US 8,368,124 B2
(45) Date of Patent: *Feb. 5, 2013

(54) ELECTROMECHANICAL DEVICES HAVING ETCH BARRIER LAYERS

(75) Inventors: Mark W. Miles, Atlanta, GA (US); John Batey, Cupertino, CA (US); Clarence Chui, San Jose, CA (US); Manish Kothari, Cupertino, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/489,250

(22) Filed: Jun. 22, 2009

(65) Prior Publication Data

US 2009/0323168 A1    Dec. 31, 2009

Related U.S. Application Data

(62) Division of application No. 10/251,196, filed on Sep. 20, 2002, now Pat. No. 7,550,794.

(51) Int. Cl.
*H01L 27/20* (2006.01)
*H01L 29/84* (2006.01)

(52) U.S. Cl. .................. 257/254; 257/E27.006

(58) Field of Classification Search .............. 257/254, 257/E27.006
See application file for complete search history.

(56) References Cited

U.S. PATENT DOCUMENTS

| | | | |
|---|---|---|---|
| 4,190,488 A | 2/1980 | Winters | |
| 4,498,953 A | 2/1985 | Cook et al. | |
| 4,500,171 A | 2/1985 | Penz et al. | |
| 4,519,676 A | 5/1985 | te Velde | |
| 4,560,435 A | 12/1985 | Brown et al. | |
| 4,566,935 A | 1/1986 | Hornbeck | |
| 4,710,732 A | 12/1987 | Hornbeck | |
| 4,880,493 A | 11/1989 | Ashby et al. | |
| 4,900,395 A | 2/1990 | Syverson et al. | |
| 4,954,789 A | 9/1990 | Sampsell | |
| 4,956,619 A | 9/1990 | Hornbeck | |
| 5,083,857 A | 1/1992 | Hornbeck | |
| 5,099,353 A | 3/1992 | Hornbeck | |
| 5,124,834 A | 6/1992 | Cusano et al. | |
| 5,190,637 A | 3/1993 | Guckel | |
| 5,216,537 A | 6/1993 | Hornbeck | |
| 5,231,532 A | 7/1993 | Magel et al. | |
| 5,293,272 A | 3/1994 | Jannson et al. | |

(Continued)

FOREIGN PATENT DOCUMENTS

CN    1378245    11/2002
DE    199 38 072    3/2000

(Continued)

OTHER PUBLICATIONS

Office Action dated Jan. 8, 2010 in Chinese App. No. 200580032155.2.

(Continued)

*Primary Examiner* — Thanh Nguyen
(74) *Attorney, Agent, or Firm* — Knobbe Martens Olson & Bear LLP

(57) ABSTRACT

In one embodiment, the invention provides a method for fabricating a microelectromechanical systems device. The method comprises fabricating a first layer comprising a film having a characteristic electromechanical response, and a characteristic optical response, wherein the characteristic optical response is desirable and the characteristic electromechanical response is undesirable; and modifying the characteristic electromechanical response of the first layer by at least reducing charge build up thereon during activation of the micro electromechanical systems device.

18 Claims, 7 Drawing Sheets

U.S. PATENT DOCUMENTS

| | | | |
|---|---|---|---|
| 5,324,683 A | 6/1994 | Fitch et al. |
| 5,345,328 A | 9/1994 | Fritz et al. |
| 5,358,806 A | 10/1994 | Haraichi et al. |
| 5,381,040 A | 1/1995 | Sun et al. |
| 5,439,763 A | 8/1995 | Shimase et al. |
| 5,454,906 A | 10/1995 | Baker et al. |
| 5,583,688 A | 12/1996 | Hornbeck |
| 5,646,768 A | 7/1997 | Kaeriyama |
| 5,656,554 A | 8/1997 | Desai et al. |
| 5,683,649 A | 11/1997 | Chatterjee et al. |
| 5,719,068 A | 2/1998 | Suzawa et al. |
| 5,726,480 A | 3/1998 | Pister |
| 5,771,321 A | 6/1998 | Stern |
| 5,784,212 A | 7/1998 | Hornbeck |
| 5,801,084 A | 9/1998 | Beasom et al. |
| 5,822,110 A | 10/1998 | Dabbaj |
| 5,825,528 A | 10/1998 | Goossen |
| 5,835,255 A | 11/1998 | Miles |
| 5,967,163 A | 10/1999 | Pan et al. |
| 5,986,796 A | 11/1999 | Miles |
| 6,008,123 A | 12/1999 | Kook et al. |
| 6,031,653 A | 2/2000 | Wang |
| 6,040,937 A | 3/2000 | Miles |
| 6,046,659 A | 4/2000 | Loo et al. |
| 6,100,477 A | 8/2000 | Randall et al. |
| 6,162,657 A | 12/2000 | Schiele et al. |
| 6,165,890 A | 12/2000 | Kohl et al. |
| 6,195,196 B1 | 2/2001 | Kimura et al. |
| 6,204,080 B1 | 3/2001 | Hwang |
| 6,215,221 B1 | 4/2001 | Cabuz et al. |
| 6,248,654 B1 | 6/2001 | Lee et al. |
| 6,288,472 B1 | 9/2001 | Cabuz et al. |
| 6,297,072 B1 | 10/2001 | Tilmans et al. |
| 6,319,824 B1 | 11/2001 | Lee et al. |
| 6,342,452 B1 | 1/2002 | Coronel et al. |
| 6,356,254 B1 | 3/2002 | Kimura |
| 6,359,673 B1 | 3/2002 | Stephenson |
| 6,376,787 B1 | 4/2002 | Martin et al. |
| 6,377,233 B2 | 4/2002 | Colgan et al. |
| 6,392,233 B1 | 5/2002 | Channin et al. |
| 6,407,851 B1 | 6/2002 | Islam et al. |
| 6,446,486 B1 | 9/2002 | deBoer et al. |
| 6,447,126 B1 | 9/2002 | Hornbeck |
| 6,448,622 B1 | 9/2002 | Franke et al. |
| 6,452,124 B1 | 9/2002 | York et al. |
| 6,452,465 B1 | 9/2002 | Brown et al. |
| 6,465,320 B1 | 10/2002 | McNeil et al. |
| 6,466,354 B1 | 10/2002 | Gudeman |
| 6,513,911 B1 | 2/2003 | Ozaki et al. |
| 6,567,312 B1 | 5/2003 | Torii |
| 6,574,033 B1 | 6/2003 | Chui et al. |
| 6,602,791 B2 | 8/2003 | Ouellet et al. |
| 6,608,268 B1 | 8/2003 | Goldsmith |
| 6,618,187 B2 | 9/2003 | Pilossof |
| 6,620,712 B2 | 9/2003 | Huang et al. |
| 6,635,919 B1 | 10/2003 | Melendez et al. |
| 6,657,832 B2 | 12/2003 | Williams et al. |
| 6,674,090 B1 | 1/2004 | Chua et al. |
| 6,674,562 B1 | 1/2004 | Miles |
| 6,689,211 B1 | 2/2004 | Wu et al. |
| 6,713,235 B1 | 3/2004 | Ide et al. |
| 6,720,267 B1 | 4/2004 | Chen et al. |
| 6,741,377 B2 | 5/2004 | Miles |
| 6,747,800 B1 | 6/2004 | Lin |
| 6,756,317 B2 | 6/2004 | Sniegowski et al. |
| 6,778,306 B2 | 8/2004 | Sniegowski et al. |
| 6,782,166 B1 | 8/2004 | Grote et al. |
| 6,791,441 B2 | 9/2004 | Pillans et al. |
| 6,794,119 B2 | 9/2004 | Miles |
| 6,806,110 B2 | 10/2004 | Lester et al. |
| 6,812,482 B2 | 11/2004 | Fleming et al. |
| 6,861,277 B1 | 3/2005 | Monroe et al. |
| 6,867,896 B2 | 3/2005 | Miles |
| 6,870,654 B2 | 3/2005 | Lin et al. |
| 6,905,613 B2 | 6/2005 | Gutierrez et al. |
| 6,940,631 B2 | 9/2005 | Ishikawa |
| 6,951,824 B2 | 10/2005 | Fischer et al. |
| 6,953,702 B2 | 10/2005 | Miller et al. |
| 6,960,305 B2 | 11/2005 | Doan et al. |
| 7,008,812 B1 | 3/2006 | Carley |
| 7,041,224 B2 | 5/2006 | Patel et al. |
| 7,049,164 B2 | 5/2006 | Bruner |
| 7,110,158 B2 | 9/2006 | Miles |
| 7,123,216 B1 | 10/2006 | Miles |
| 7,550,794 B2 * | 6/2009 | Miles et al. ............. 257/254 |
| 7,781,850 B2 * | 8/2010 | Miles et al. ............. 257/414 |
| 2001/0003487 A1 | 6/2001 | Miles |
| 2002/0003400 A1 | 1/2002 | Lee |
| 2002/0014579 A1 | 2/2002 | Dunfield |
| 2002/0021485 A1 | 2/2002 | Pilossof |
| 2002/0024711 A1 | 2/2002 | Miles |
| 2002/0027636 A1 | 3/2002 | Yamada |
| 2002/0054424 A1 | 5/2002 | Miles |
| 2002/0055253 A1 | 5/2002 | Rudhard |
| 2002/0070931 A1 | 6/2002 | Ishikawa |
| 2002/0086455 A1 | 7/2002 | Franosch et al. |
| 2002/0110948 A1 | 8/2002 | Huang et al. |
| 2002/0117728 A1 | 8/2002 | Brosnihhan et al. |
| 2002/0125822 A1 * | 9/2002 | Graff et al. ............. 313/506 |
| 2002/0135857 A1 | 9/2002 | Fitzpatrick et al. |
| 2002/0195681 A1 | 12/2002 | Melendez et al. |
| 2003/0003682 A1 | 1/2003 | Moll et al. |
| 2003/0003761 A1 | 1/2003 | Yang et al. |
| 2003/0006468 A1 | 1/2003 | Ma et al. |
| 2003/0029831 A1 | 2/2003 | Kawase |
| 2003/0047533 A1 | 3/2003 | Reid et al. |
| 2003/0071015 A1 | 4/2003 | Chinn et al. |
| 2003/0072070 A1 | 4/2003 | Miles |
| 2003/0111439 A1 | 6/2003 | Fetter et al. |
| 2003/0138986 A1 | 7/2003 | Bruner |
| 2003/0202264 A1 | 10/2003 | Weber et al. |
| 2003/0202265 A1 | 10/2003 | Reboa et al. |
| 2004/0028849 A1 | 2/2004 | Stark et al. |
| 2004/0035821 A1 | 2/2004 | Doan et al. |
| 2004/0038513 A1 | 2/2004 | Kohl et al. |
| 2004/0051929 A1 | 3/2004 | Sampsell et al. |
| 2004/0053434 A1 | 3/2004 | Bruner |
| 2004/0080832 A1 | 4/2004 | Singh |
| 2004/0124073 A1 | 7/2004 | Pilans et al. |
| 2004/0136076 A1 | 7/2004 | Tayebati |
| 2004/0217264 A1 | 11/2004 | Wood et al. |
| 2004/0244191 A1 | 12/2004 | Orr et al. |
| 2005/0045276 A1 | 3/2005 | Patel et al. |
| 2008/0026328 A1 | 1/2008 | Miles |
| 2008/0130089 A1 | 6/2008 | Miles |
| 2010/0320555 A1 * | 12/2010 | Miles et al. ............. 257/433 |

FOREIGN PATENT DOCUMENTS

| | | |
|---|---|---|
| EP | 0 035 299 | 9/1983 |
| EP | 0 695 959 | 2/1996 |
| EP | 0 788 005 | 8/1997 |
| EP | 1 209 738 | 5/2002 |
| EP | 1 452 481 | 9/2004 |
| JP | 49-004993 | 1/1974 |
| JP | 01-102415 | 4/1989 |
| JP | 5-49238 | 2/1993 |
| JP | 05275401 | 10/1993 |
| JP | 06-350105 | 12/1994 |
| JP | 07-098326 | 4/1995 |
| JP | 07-060844 | 7/1995 |
| JP | 09-33942 | 7/1997 |
| JP | 10-020328 | 1/1998 |
| JP | 10-148644 | 6/1998 |
| JP | 10-209176 | 8/1998 |
| JP | 11-258777 | 9/1999 |
| JP | 2000-28938 | 1/2000 |
| JP | 2001-085519 | 3/2001 |
| JP | 2002-287047 | 3/2001 |
| JP | 2001-272613 | 10/2001 |
| JP | 2002-124534 | 4/2002 |
| JP | 2002-207182 | 7/2002 |
| JP | 2002-243937 | 8/2002 |
| JP | 2002-328313 | 11/2002 |
| JP | 2003-001598 | 1/2003 |
| JP | 2003-136499 | 5/2003 |
| JP | 2003-315732 | 11/2003 |
| JP | 2003-340795 | 12/2003 |

| | | |
|---|---|---|
| JP | 2004-106074 | 4/2004 |
| TW | 590983 | 6/2004 |
| TW | 593124 | 6/2004 |
| WO | WO 91/05284 | 4/1991 |
| WO | WO 92/10925 | 6/1992 |
| WO | WO 95/30924 | 11/1995 |
| WO | WO 98/29748 | 7/1998 |
| WO | WO 99/52006 | 10/1999 |
| WO | WO 01/14248 | 3/2001 |
| WO | WO 01/63657 | 8/2001 |
| WO | WO 02/24570 | 3/2002 |
| WO | WO 2005/085932 | 9/2005 |

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).
Aratani K. et al. "Surface Micromachined Tuneable Interferometer Array," Sensors and Actuators A, Elsevier Sequoia S.A., Lausanne, CH, vol. A43, No. 1/3, May 1, 1994, pp. 17-23.
Ibbotson et al., "Comparison of XeF2 and F-atom reactions with Si and SiO2," Applied Physics Letters, vol. 44, No. 12, pp. 1129-1131 (Jun. 1984).
Raley et al., "A Fabry-Perot Microinterferometer for Visible Wavelengths," IEEE Solid-State Sensor and Actuator Workshop, Hilton Head, SC, pp. 170-173 (1992).
Sridharan et al. "Post-packaging Release a New Concept for Surface-Micromachined Devices" Technical Digest, IEEE Solid-State Sensor & Actuator Workshop, New York, NY US Nov. 8, 1998 pp. 225-228.
Williams, et al. Etch Rates for Micromachining Processing. Journal of Microelectromechanical Systems, vol. 5, No. 4, pp. 256-259, (Dec. 1996).
Winters, et al. The etching of silicon with XeF2 vapor. Applied Physics Letters, vol. 34, No. 1, pp. 70-73, (Jan. 1979).
ISR and WO for PCT/US05/030902 Dated Jan. 26, 2006.
IPRP for PCT/US05/030902 dated Apr. 5, 2007.
Examiner's Report dated Feb. 26, 2008 in Australian App. No. 2003275194.
Office Action dated Dec. 7, 2007 in Chinese App. No. 03821986.7.
Office Action dated May 9, 2008 in Chinese App. No. 03821986.7.
Office Action dated Aug. 15, 2008 in Chinese App. No. 03821986.7.
Official Action received Oct. 5, 2007 in Russian App. No. 2005111765.
Official Action received May 26, 2008 in Russian App. No. 2005111765.
Office Action dated Nov. 14, 2008 in Chinese App. No. 200580032155.2.
Yao et al., BrF3 dry release technology for large freestanding parylene microstructures and electrostatic actuators, Sensors and Actuators A, vol. 97-98, pp. 771-775, Apr. 2002.
Office Action dated Aug. 20, 2004 in U.S. Appl. No. 10/251,196.
Office Action dated Dec. 28, 2005, in U.S. Appl. No. 10/251,196.
Office Action dated Jun. 6, 2006 in U.S. Appl. No. 10/251,196.
Office Action dated Dec. 1, 2006 in U.S. Appl. No. 10/251,196.
Office Action dated May 14, 2007 in U.S. Appl. No. 10/251,196.
Office Action dated Dec. 3, 2007 in U.S. Appl. No. 10/251,196.
Office Action dated Jul. 18, 2008 in U.S. Appl. No. 10/251,196.
ISR for PCT/US03/30016 dated Apr. 27, 2004.
Decision of Final Rejection dated Nov. 28, 2008 in Chinese App. No. 03821986.7.
Official Action dated May 13, 2009 in Russian App. No. 2005111765.
Notice of Reasons for Rejection dated Jul. 28, 2009 in Japanese App. No. 2004-538461.
Supplementary European Search Report dated Oct. 19, 2010 in App. No. 03759463.7.
Boucinha et al., 2000, Amorphous silicon air-gap resonators on large-area substrates, Applied Physics Letters, 77(6):907-909.
Rusu et al., 2001, Planarization of deep trenches, Proc. SPIE, 4557:49-57.
Notice of Reasons for Rejection dated Aug. 10, 2010 in Japanese App. No. 2004-538461.
Notice of Grounds for Rejection dated Jul. 27, 2010 in Korean App. No. 2005-7004794.
Examiner's Report dated Mar. 13, 2012 in Canadian patent application No. 2,499,208.
Office Action dated Jan. 6, 2012 in U.S. Appl. No. 12/861,778.
Office Action dated Jun. 24, 2011 in U.S. Appl. No. 12/861,778.
Office action dated Sep. 27, 2011 in Taiwanese App. No. 094131698.
Notice of the Final Rejection dated Feb. 25, 2011 in Korean App. No. 2005-7004794.
Notice of Grounds for Rejection dated May 23, 2011 in Korean App. No. 2011-7009971.
Office Action dated May 16, 2011 in Canadian App. No. 2,581,670.

\* cited by examiner

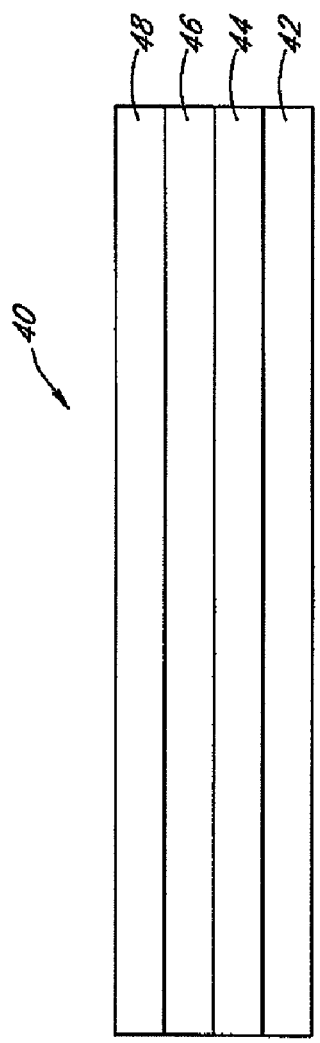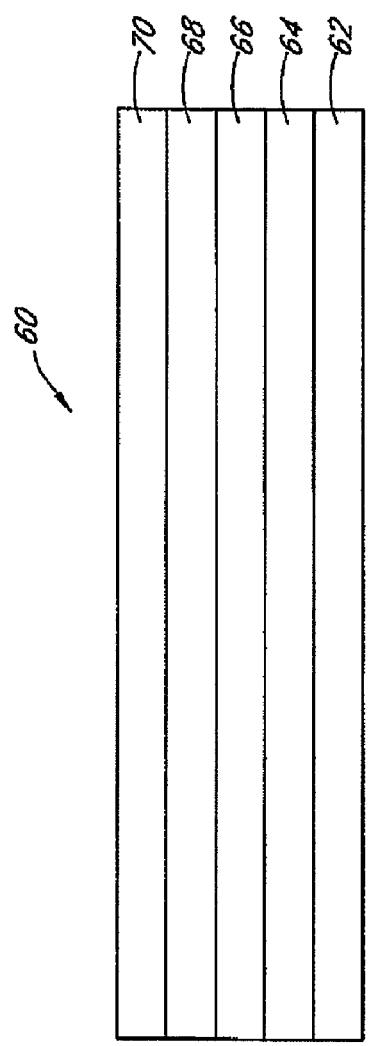
FIG. 4
FIG. 6

US 8,368,124 B2

ELECTROMECHANICAL DEVICES HAVING ETCH BARRIER LAYERS

CROSS-REFERENCE TO RELATED APPLICATIONS

This application is a divisional of U.S. patent application Ser. No. 10/251,196, filed Sep. 20, 2002, now issued as U.S. Pat. No. 7,550,794, the disclosure of which is incorporated by reference herein.

FIELD OF THE INVENTION

This invention relates to microelectromechanical systems devices. In particular it relates to thin film structures in microelectromechanical systems devices and to electromechanical and optical responses of such thin film structures.

BACKGROUND OF THE INVENTION

Today a wide variety of micro electromechanical systems (MEMS) devices may be fabricated using microfabrication techniques. Examples of these MEMS devices include motors, pumps, valves, switches, sensors, pixels, etc.

Often these MEMS devices harness principles and phenomena from different domains such as the optical, electrical and mechanical domains. Such principles and phenomena, while seemingly difficult to harness in the macroscopic world, can become extremely useful in the microscopic world of MEMS devices, where such phenomena become magnified. For example, electrostatic forces which are generally considered to be too weak in the macroscopic world to be harnessed, are strong enough in the microscopic world of MEMS devices to activate these devices, often at high speeds and with low power consumption.

Materials used in MEMS devices are generally selected based on their inherent properties in the optical, electrical, and mechanical domains and the characteristic response to input, such as for example, a driving or actuation voltage.

One problem affecting the fabrication of MEMS devices is that in some cases, a material having a highly desirable response to input, for example an optical response to incident light, may also have an undesirable response to input, for example, an electromechanical response to an actuation or driving voltage. To overcome, or at least reduce, the undesirable response, new materials have to be found or developed often at great expense.

Another problem with the fabrication of MEMS devices is that sometimes, a material selected for its characteristic response may become damaged due to exposure to chemical agents used during a particular micro fabrication process. This causes the material to demonstrate less of the characteristic response to the input.

SUMMARY OF THE INVENTION

In one embodiment, the invention provides a method for fabricating a microelectromechanical systems device. The method comprises fabricating a first layer comprising a film or structured film having a characteristic electromechanical response, and a characteristic optical response, wherein the characteristic optical response is desirable and the characteristic electromechanical response is undesirable; and modifying the characteristic electromechanical response of the first layer by manipulating charge build up thereon during activation of the micro electromechanical systems device.

BRIEF DESCRIPTION OF THE DRAWINGS

FIG. 4 shows one embodiment of a thin film stack for a MEMS device, in accordance with one embodiment of the invention;

FIG. 6 shows another embodiment of a thin film stack for a MEMS device;

DETAILED DESCRIPTION OF THE PREFERRED EMBODIMENT

A particular structure or layer within a microelectromechanical systems (MEMS) device may be desirable for its optical response to input in the form of incident light, but may at the same time have an undesirable electromechanical response to input in the form of an actuation or driving voltage. The present invention discloses techniques to manipulate or control the electromechanical response of the structure or layer, thus at least reducing the undesirable electromechanical response.

Figure 1:
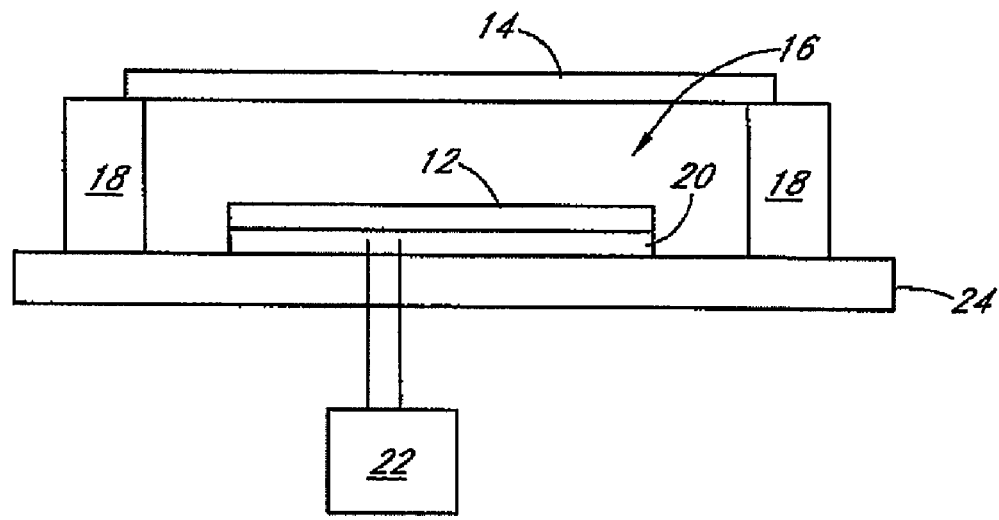
FIGS. 1 and 2 show a block diagram of a MEMS device in an unactuated, and an actuated state respectively.

As an illustrative, but a non-limiting example of a MEMS device, consider the interference modulator (IMOD) device 10 shown in FIG. 1 of the drawings. Referring to FIG. 1, it will be seen that IMOD device 10 has been greatly simplified for illustrative purposes so as not to obscure aspects of the present invention.

Figure 2:
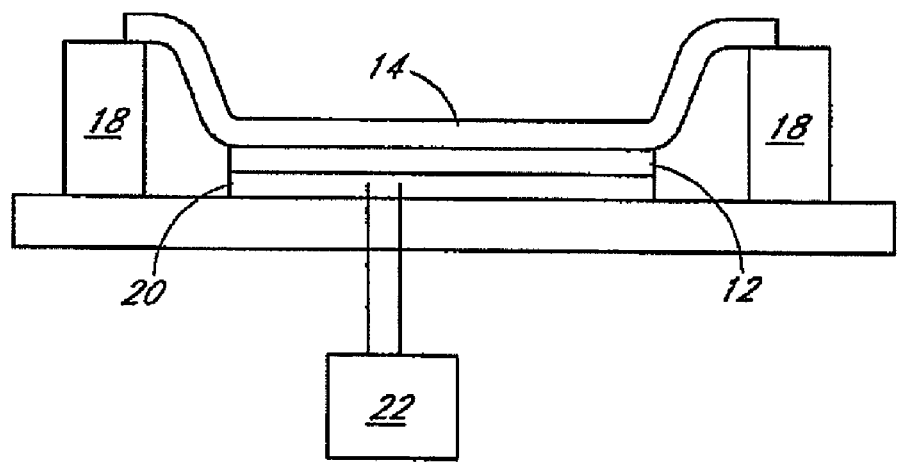

The IMOD device 10 includes a transparent layer 12 and a reflective layer 14 which is spaced from the transparent layer 12 by an air gap 16. The transparent layer 14 is supported on posts 18 and is electrostatically displaceable towards the transparent layer 12 thereby to close the air gap 16. An electrode 20 which is connected to a driving mechanism 22 is used to cause the electrostatic displacement of reflective layer 14. FIG. 1 shows the reflective layer 14 in an undriven or undisplaced condition, whereas FIG. 2 shows the reflective layer 14 in a driven or displaced condition. The reflective layer 14 is generally selected to produce a desired optical response to incident light when it is brought into contact with the transparent layer 12. In one IMOD design, the transparent layer 12 may comprise $SiO_2$. The electrode 20 and the transparent layer 12 are formed on a substrate 24. The substrate 24, the electrode 20, and the transparent layer 12 thereon will be referred to as a "thin film stack."

Typically, a plurality of IMOD devices 10 are fabricated in a large array so as to form pixels within a reflective display. Within such a reflective display, each IMOD device 10 essentially defines a pixel which has a characteristic optical response when in the undriven state, and a characteristic optical response when in the driven state. The transparent layer 12 and the size of the air gap 16 maybe selected so that an IMOD within the reflective display may reflect red, blue, or green light when in the undriven state and may absorb light when in the driven state.

It will be appreciated that during operation of the reflective display, the IMOD devices 10 are rapidly energized, and de-energized in order to convey information. When energized, the reflective layer 14 of an IMOD 10 device is electrostatically driven towards the transparent layer 12, and when the IMOD 10 is de-energized, the reflective layer 14 is allowed to return to its undriven state. In order to keep the reflective layer 14 in its driven condition, a bias voltage is applied to each IMOD device 10.

If an actuation voltage, $V_{actuation}$, defined as a voltage required to electrostatically drive the reflective layer 14 of an IMOD device to its driven condition, as showed in FIG. 2 of the drawings, is equal to a release voltage, $V_{release}$, defined as the voltage at which the reflective layer 14 returns to its undisplaced condition, as is shown in FIG. 1 of the drawings, then it becomes extremely difficult to select an appropriate bias voltage, $V_{bias}$, that can be applied to all of the IMOD's 10 within the reflective display to keep the reflective layers 14 of each respective IMOD device 10 within the reflective display in its driven condition. The reason for this is that each IMOD 10 within the reflective display may have slight variations, for example, variations in a thickness of the layers 12, 14, etc., which, in practice, result in a different release voltage, $V_{release}$, for each IMOD 10. Further, due to line resistance, there will be variations in the actual voltage applied to each IMOD 10, based on its position within the display. This makes it very difficult, if not impossible, to select a value for $V_{bias}$ that will keep the reflective layer 14 of each respective IMOD 10 within the reflective display in its driven condition. This is explained with reference to FIG. 3 of the drawings, which shows the observed hysteresis behavior of the reflective layer 14 of an IMOD 10, in which the transparent layer 12 comprised $SiO_2$.

Figure 3:
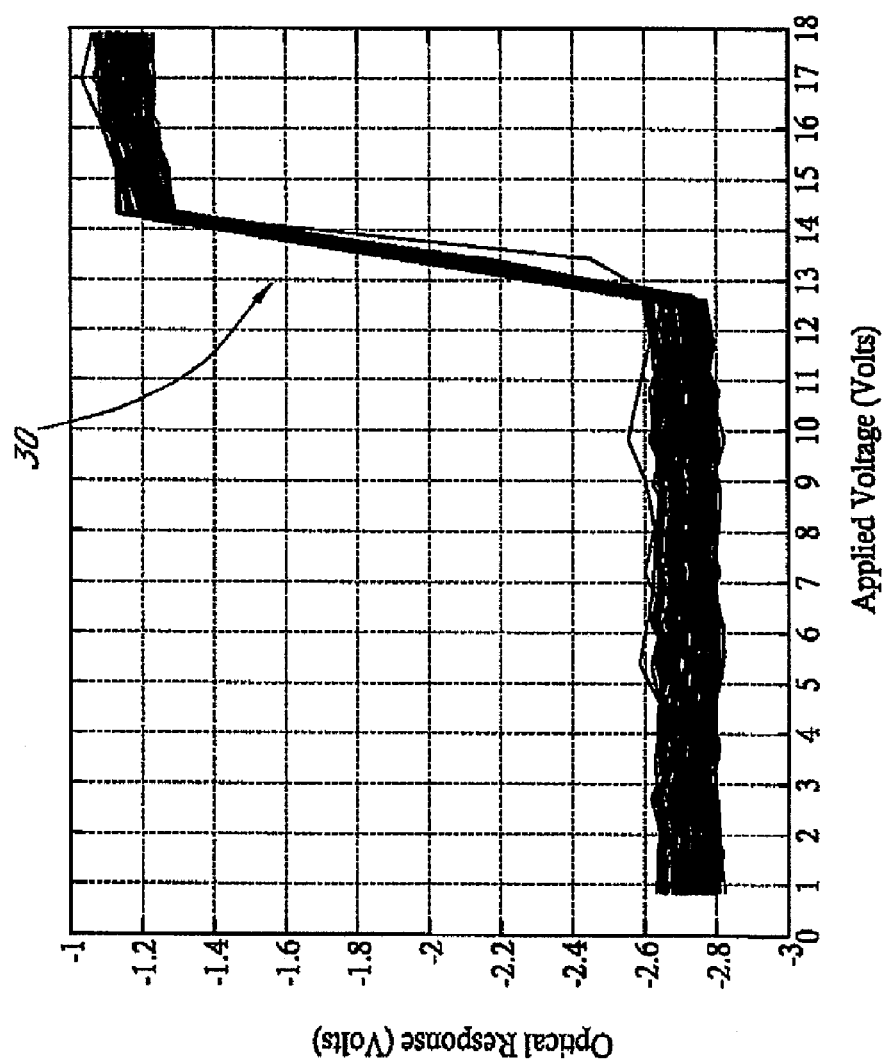
FIG. 3 shows a chart of the actuation and release voltages for the MEMS device of FIGS. 1 and 2.

Referring to FIG. 3, a curve, 30 is shown, which plots applied voltage (in volts) on the X-axis, against optical response measured in the volts on the Y-axis for an IMOD 10 comprising a transparent layer of $SiO_2$. As can be seen, actuation of the reflective layer 14 occurs at about 12.5 volts, i.e., $V_{actuation}$ equals 12.5 volts, and the reflective layer 14 returns to its undriven condition when the applied voltage falls to below 12.5 volts, i.e., $V_{release}$, equals 12.5 volts. Thus, the reflective layer 14 in an IMOD device 10 in which the transparent layer comprises only $SiO_2$ demonstrates no hysteresis. Therefore, if the reflective display is fabricated using IMOD devices 10, each comprising a transparent layer 12 having only $SiO_2$, it would be impossible to select a value for $V_{bias}$. For example, if $V_{bias}$ is selected to be 12.5 volts, because of variations within the IMOD devices 10 in the reflective display, for at least some of the IMOD devices 10, a $V_{bias}$ of 12.5 volts would fail to keep the reflective layer 14 of those IMOD devices 10 in the driven condition.

In order to select a $V_{bias}$ that is sufficient to keep the reflective layer 14 of a respective IMOD device 10 within a reflective display in its driven condition, it is necessary for each reflective layer 14 of a respective IMOD device 10 within the reflective display to demonstrate some degree of hysteresis, defined as a non-zero difference between the $V_{actuation}$ and $V_{release}$.

It will be appreciated that the electromechanical response of the reflective layer 14 of each IMOD device 10 is determined by the electromechanical properties of the reflective layer 14 as well as the electrical properties of the transparent layer 12. In one particular IMOD device design, the transparent layer 12 comprises $SiO_2$ which gives a desired optical response when the reflective layer 14 is brought into contact therewith. However, the transparent layer 12 comprising $SiO_2$ has a certain electrical characteristic or property (the $SiO_2$ traps negative charge) that affects the hysteresis behavior of the reflective layer 14. Thus, the transparent layer 12 has a desired optical response but an undesirable electromechanical response to a driving or actuation voltage which affects the hysteresis behavior of the reflective layer 14.

In accordance with embodiments of the present invention, the electromechanical behavior of the transparent layer 12 is altered by adding a further layer to the thin film stack. This further layer at least minimizes or compensates for the effect of transparent layer 12 on the hysteresis behavior of the reflective layer 14.

In one embodiment of the invention, the further layer comprises $Al_2O_2$ which is deposited, in accordance with known deposition techniques, over the transparent layer 12. This results in a thin film stack 40 as shown in FIG. 4 of the drawings, comprising a substrate 42, an electrode 44, an $SiO_2$ reflective layer 46 and an $Al_2O_3$ layer 48 which functions as a charge trapping layer.

Figure 5:
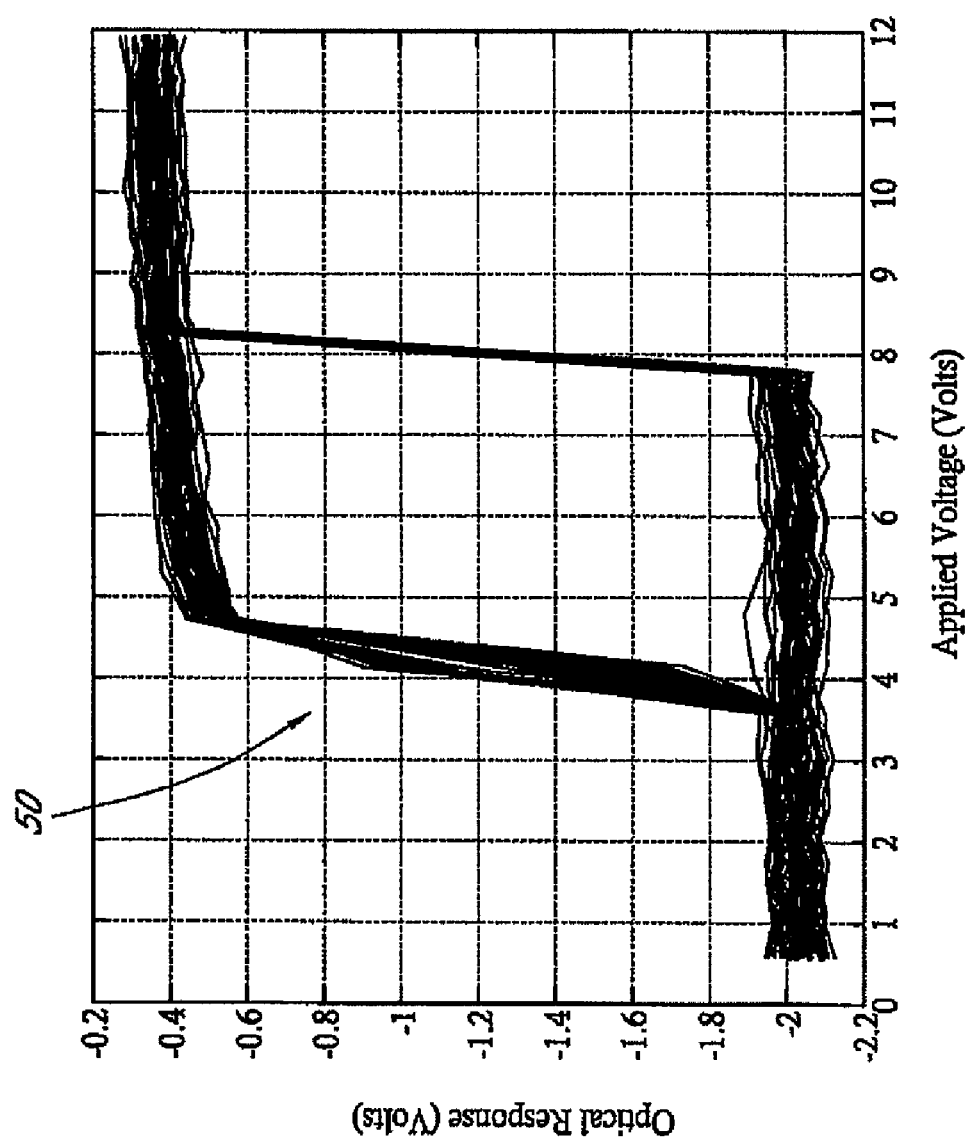
FIG. 5 shows a hysteresis curve for a MEMS device including the thin film stack shown in FIG. 4 of the drawings.

FIG. 5 of the drawings shows a hysteresis curve 50 for an IMOD device 10 comprising the thin film stack 40. As with the hysteresis curve 30, the X-axis plots applied voltage in Volts, whereas the Y-axis plots optical response in Volts. The hysteresis curve 50 shows a hysteresis window of 2.8 volts defined as the difference between $V_{actuation}$ (7.8 volts) and $V_{release}$ (5.0 volts). When the individual IMOD's 10 within a reflective display each have a respective reflective layer 14 which demonstrates hysteresis in accordance with the hysteresis curve 50, it will be seen that it is possible to choose a value for the $V_{bias}$ between 5 volts and 7.8 volts which will effectively perform the function of keeping the reflective layer 14 of each respective IMOD device 10 within the reflective display in its driven condition. In a further embodiment of the invention, the thin film stack may be further modified to include an Aha) layer above, as well as below, the reflective layer 12. This embodiment is shown in FIG. 6 of the drawings, where it will be seen that the thin film stack 60 includes a substrate 62, an electrode 64, a first $Al_2O_3$, layer 66, an $SiO_2$ transparent layer 68 and a second $Al_2O_3$ layer 70.

Figure 7:
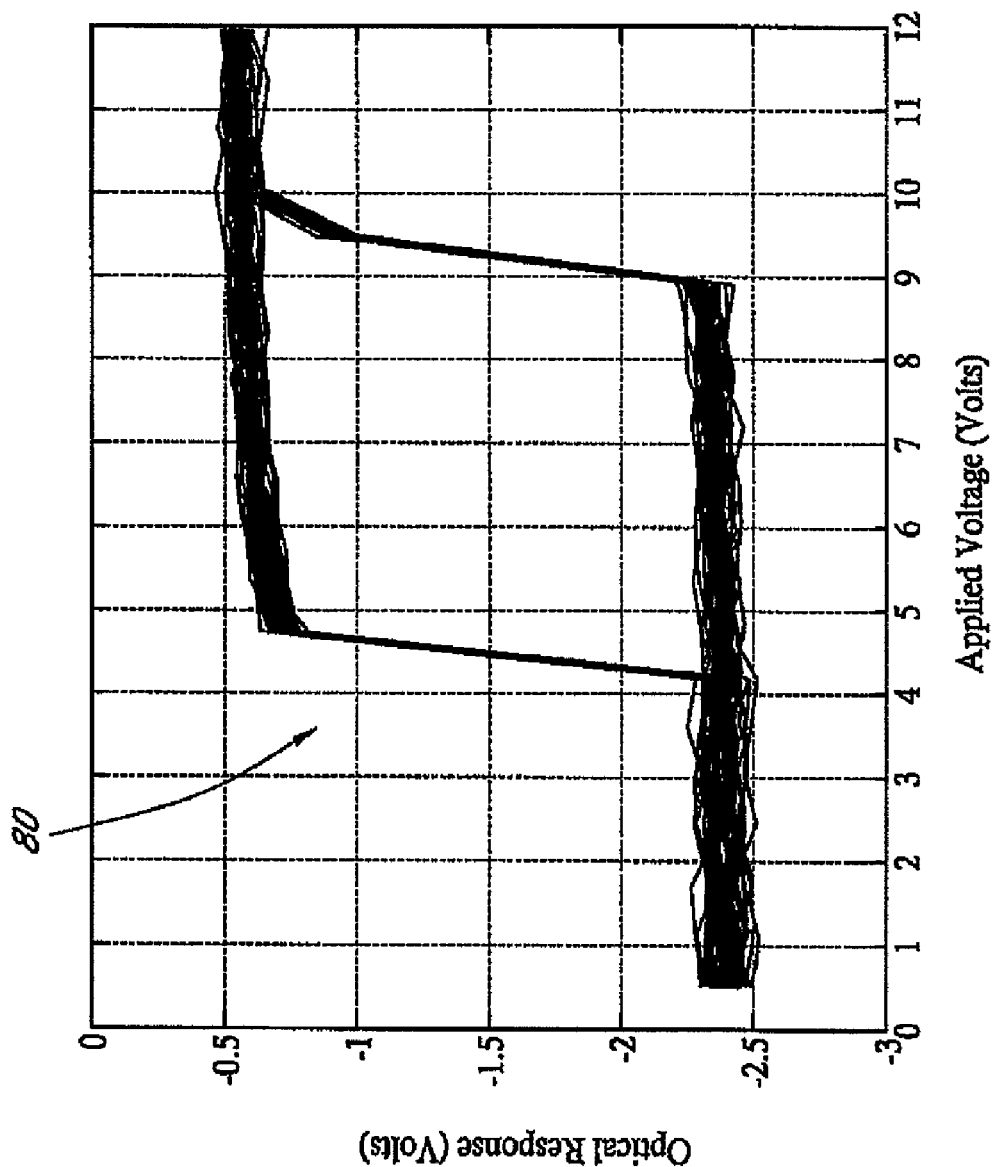
FIG. 7 shows a hysteresis curve for a MEMS device including the thin film stack of FIG. 6 of the drawings.

FIG. 7 of the drawings shows a hysteresis curve 80 for a transparent layer 14 of an IMOD device 10 having the thin film stack 60 shown in FIG. 6 of the drawings. As will be seen, the hysteresis window is now wider. i.e., 4.5 volts, being the difference between $V_{actuation}$ (9 volts) and $V_{release}$ (4.5 volts).

However, other materials that have a high charge trapping density may be used. These materials include $AlO_x$, which is the off-stoichiometric version of $Al_2O_3$, silicon nitride ($Si_3N_4$), its off-stoichiometric version ($SiN_x$), and tantalum pentoxide ($Ta_2O_5$) and its off-stoichiometric version ($TaO_x$). All of these materials have several orders of magnitude higher charge trapping densities than $SiO_2$ and tend to trap charge of either polarity. Because these materials have a high charge trapping density, it is relatively easy to get charge into and out of these materials, as compared to $SiO_2$, which has a low charge trapping density and has an affinity for trapping negative charge only.

Other examples of materials that have a high charge trapping density include the rare earth metal oxides (e.g., hafnium oxide), and polymeric materials. Further, semiconductor materials doped to trap either negative or positive charge may be used to form the further layer above, and optionally below the $SiO_2$ transparent layer 12.

Thus far, a technique for manipulating the electromechanical behavior of a MEMS device has been described, wherein charge buildup within the MEMS device is controlled by the use of a charge trapping layer which has a high charge trapping density. However, it is to be understood that the invention covers the use of any charge trapping layer to alter or control the electromechanical behavior of a MEMS device regardless of the charge trapping density thereof. Naturally, the choice of a charge trapping layer whether it be of a high, low, or medium charge trapping density will be dictated by what electromechanical behavior for a MEMS device is being sought.

In some embodiments the incorporation of metals, in the form of thin layers or aggregates, provide yet another mechanism for manipulating the charge trapping density of a host film in a MEMS device. Structuring the host film by producing voids or creating a variation or periodicity in its material characteristics may also be used to alter the charge trapping characteristics.

According to another embodiment of the invention, an IMOD device 10 includes a chemical barrier layer deposited over the reflective layer 12 in order to protect the reflective layer 12 from damage or degradation due to exposure to chemical etchants in the micro fabrication process. For example, in one embodiment, the transparent layer 12 which comprises $SiO_2$, is protected by an overlying layer comprising $Al_2O_3$, which acts as a chemical barrier to etchants, for example, $XeF_2$. In such embodiments, it has been found that when the transparent $SiO_2$ layer 12 is protected from the etchants, nonuniformities in the $SiO_2$ are eliminated along with attendant nonuniformities in electromechanical behavior, thus causing the transparent layer 14 within each IMOD device 10 to display hysteresis.

Figure 8A:
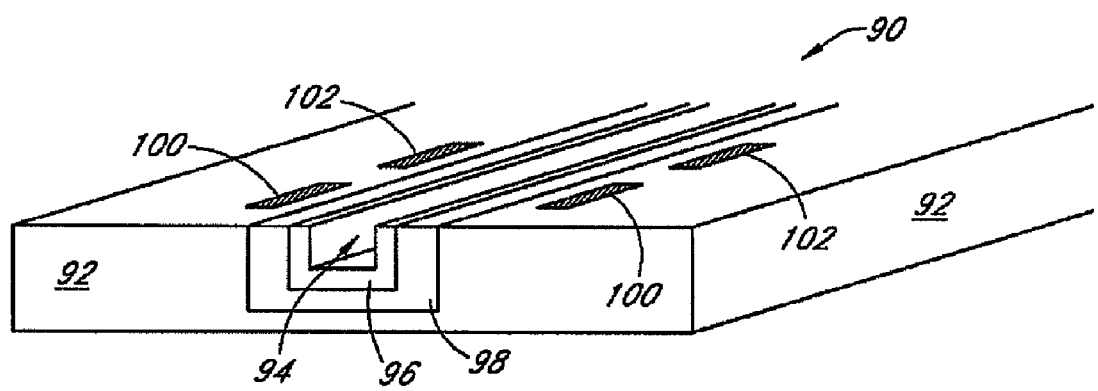
FIG. 8*a* shows a block diagram of an electrostatic fluid flow system within a MEMS device in accordance with one embodiment of the invention.
Figure 8B:
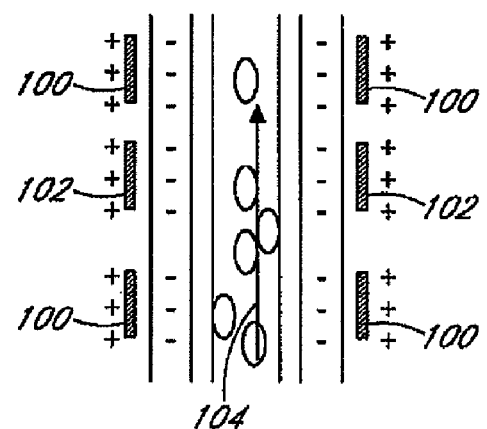
FIG. 8*b* shows a schematic drawing of the fluid flow system of FIG. 8*a* illustrating its principle of operation.

FIGS. 8a and 8b show another application within a MEMS device wherein a charged trapping layer is used to control the electromagnetic behavior of a structure within the MEMS device.

Referring to FIG. 8a, reference numeral 90 generally indicates a portion of an electrostatic fluid flow system. The electrostatic fluid flow system includes a substrate 92 within which is formed a generally U-shaped channel 94. The channel 94 includes an inner layer 96 of a first material which is selected, for example, because of its chemical and mechanical properties, for example, the material may be particularly wear-resistant, and may demonstrate little degradation due to the flow a fluid within the channel. The channel 94 also includes an outer layer 98 which is selected for its charge-trapping properties, as will be explained in greater detail below.

The electrostatic fluid flow system 90 also includes pairs of electrodes 100 and 102 which are selectively energized to cause displacement of charge particles within a fluid in the channel 94 in the direction indicated by the arrow 104 in FIG. 8b of the drawings. In one embodiment, the outer layer 98 traps charge in the fluid thereby to provide greater control of fluid flow within the system 101. In another embodiment, the layer 98 may trap charge in order to eliminate or to reduce hysteresis effects.

Figure 9:
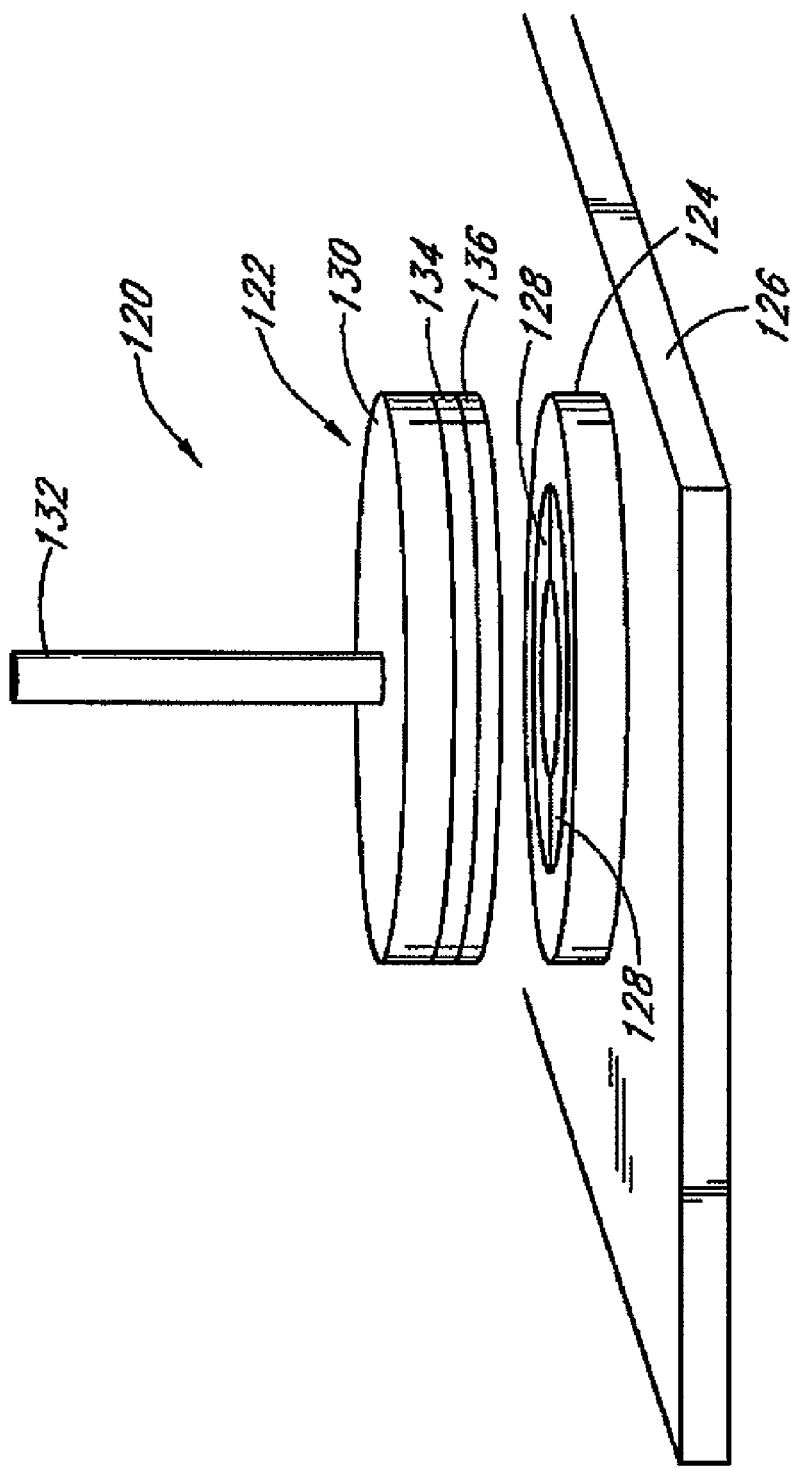
FIG. 9 shows another embodiment of a MEMS device in accordance with the invention.

Referring now to FIG. 9 of the drawings, another application of using a charge-trapping layer to alter the electromechanical behavior of a structure within a MEMS device is shown. In FIG. 9, reference numeral 120 generally indicates a motor comprising a rotor 122 which is axially aligned and spaced from a stator of 124. As can be seen, the stator 124 is formed on a substrate 126 and includes electrodes 128, which, in use, are energized by a driving mechanism (not shown). The rotor 122 includes a cylindrical portion 130 which is fast with a spindle 132. The rotor 122 may be of a material that may be selected for its mechanical properties, including resistance to wear, but may have undesirable electrical properties in response to input, such as when the electrodes 128 are energized in order to cause rotation of the rotor 122. In order to compensate for these undesirable electrical properties, layers 134 and 136 are deposited on the rotor 122 in order to effectively act as a charge trapping layer to alter the electromechanical behavior of the rotor 122.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. An apparatus, comprising:
   a substrate;
   an electrode, wherein the electrode is located over the substrate;
   an additional layer located over the electrode, wherein the additional layer comprises $SiO_2$,
   an etch barrier layer, wherein the etch barrier layer is located over the additional layer;
   an air gap, wherein the air gap is located adjacent the etch barrier layer; and
   a displaceable layer, wherein the displaceable layer is reflective to incident light.

2. The apparatus of claim 1, wherein the etch barrier layer is resistant to $XeF_2$.

3. The apparatus of claim 1, wherein the etch barrier layer comprises $Al_2O_3$.

4. The apparatus of claim 1, wherein the apparatus is an interferometric modulator.

5. The apparatus of claim 1, wherein the displaceable layer is electrostatically displaceable.

6. The apparatus of claim 1, wherein the displaceable layer is displaceable through the air gap.

7. The apparatus of claim 1, wherein the additional layer is substantially transparent.

8. A method of making the apparatus of claim 1, comprising:
   forming an electrode layer over a substrate;
   forming an additional layer over the electrode layer, wherein the additional layer comprises $SiO_2$;
   forming an etch barrier layer over the transparent layer; and
   exposing the etch barrier layer to a chemical etchant, wherein the etch barrier layer is resistant to the chemical etchant.

9. The method of claim 8, wherein the etch barrier layer comprises $Al_2O_3$.

10. The method of claim 8, wherein the chemical etchant comprises $XeF_2$.

11. The method of claim 8, additionally comprising forming a displaceable layer, wherein the displaceable layer is separated from the etch barrier layer by an air gap.

12. The method of claim 8, wherein the apparatus is an interferometric modulator.

13. The method of claim 8, wherein the additional layer is substantially transparent.

14. An electromechanical device comprising:
   a substrate;
   an electrode, wherein the electrode is located on the substrate;
   an air gap;
   an additional layer, wherein the additional layer comprises $SiO_2$, and wherein the additional layer is located between the electrode and the air gap; and
   an etch barrier layer comprising $Al_2O_3$, wherein the etch barrier layer is located between the air gap and the additional layer.

15. The device of claim 14, further comprising an electrostatically displaceable layer located on the opposite side of the air gap from the electrode.

16. The apparatus of claim 14, additionally comprising a layer comprising $Al_2O_3$ located between the additional layer and the electrode.

17. The device of claim 14, wherein the device is an interferometric modulator.

18. The device of claim 14, wherein the etch barrier layer is located on or adjacent the additional layer.

* * * * *